US012735639B2

(12) United States Patent
Banno et al.

(10) Patent No.: US 12,735,639 B2
(45) Date of Patent: Sep. 15, 2026

(54) PHOSPHOR POWDER, WAVELENGTH CONVERSION BODY, AND LIGHT EMITTING DEVICE

(71) Applicant: DENKA COMPANY LIMITED, Tokyo (JP)

(72) Inventors: Hiroki Banno, Tokyo (JP); Hiroaki Toyoshima, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 544 days.

(21) Appl. No.: 18/276,738

(22) PCT Filed: Feb. 25, 2022

(86) PCT No.: PCT/JP2022/007868
§ 371 (c)(1),
(2) Date: Aug. 10, 2023

(87) PCT Pub. No.: WO2022/186069
PCT Pub. Date: Sep. 9, 2022

(65) Prior Publication Data
US 2024/0124773 A1 Apr. 18, 2024

(30) Foreign Application Priority Data
Mar. 2, 2021 (JP) ................................ 2021-032318

(51) Int. Cl.
*C09K 11/77* (2006.01)
*H10H 20/851* (2025.01)

(52) U.S. Cl.
CPC .................. *C09K 11/77928* (2021.01); *C09K 11/77927* (2021.01); *H10H 20/8512* (2025.01)

(58) Field of Classification Search
CPC .......... H10K 20/8512; C09K 11/77928; C09K 11/77927
See application file for complete search history.

(56) References Cited

U.S. PATENT DOCUMENTS 11,641,009 B2 5/2023 Fukuda et al.
2010/0163896 A1 7/2010 Park et al.
2021/0249569 A1 8/2021 Fukuda et al.
2022/0177780 A1 6/2022 Hirosaki

FOREIGN PATENT DOCUMENTS

CN 101831295 A 9/2010
CN 102766454 A 11/2012
CN 104152144 A 11/2014
JP 2015-061009 A 3/2015
WO 2019/240150 A1 12/2019
WO 2020/015412 A1 1/2020
WO 2020/203234 A1 10/2020

OTHER PUBLICATIONS

Chuang et al., "Double substutition induced tunable photoluminescence in the Sr2Si5N8:Eu phosphor lattice", New J. Chem. 2015, 39, pp. 6958-6964, Jul. 1, 2015.*
Yeh et al., "Origin of THermal Degradation of Se1-xSi5N8:eux phoshors in Air for Light-Emitting Diodes", J. Am. Chem. Soc., 2012, 134, 14108-14117, Jul. 25, 2012.*
Apr. 12, 2022 International Search Report issued in International Patent Application No. PCT/JP2022/007868.
Chiao-Wen Yeh et al. "Origin of Thermal Degradation Of Sr2-XSi5N8:EuX Phosphors in Air for Light-Emitting Diodes". Journal of the American Chemical Society, 2012, vol. 134, pp. 14108-14117.
Wang Chuang et al., "Double substitution induced tunable photoluminescence in the Sr2Si5N8:Eu phosphor lattice", Royal Society Of Chemistry, New J. Chem., (2015), pp. 6958-6964.
May 17, 2024 Office Action issued in Chinese Patent Application No. 202280017924.5.

* cited by examiner

*Primary Examiner* — C Melissa Koslow
(74) *Attorney, Agent, or Firm* — Oliff PLC

(57) ABSTRACT

A phosphor powder containing a phosphor represented by General Formula (I) below. In General Formula (I), M1 includes at least La and optionally further includes one or more elements selected from the group made of lanthanoid elements other than Y and La, M2 includes at least Ba and optionally further includes one or more elements selected from the group made of Mg, Ca, and Sr, x is equal to or more than 0.005 and equal to or less than 0.2, y is equal to or more than 0 and equal to or less than 0.1, and z is more than 0.44 and equal to or less than 0.99: $(Eu_{(1-x)(1-z)}M1_xM2_{(1-x)z})_2(Si_{1-y}Al_y)_5N_8$ . . . (I).

6 Claims, 1 Drawing Sheet

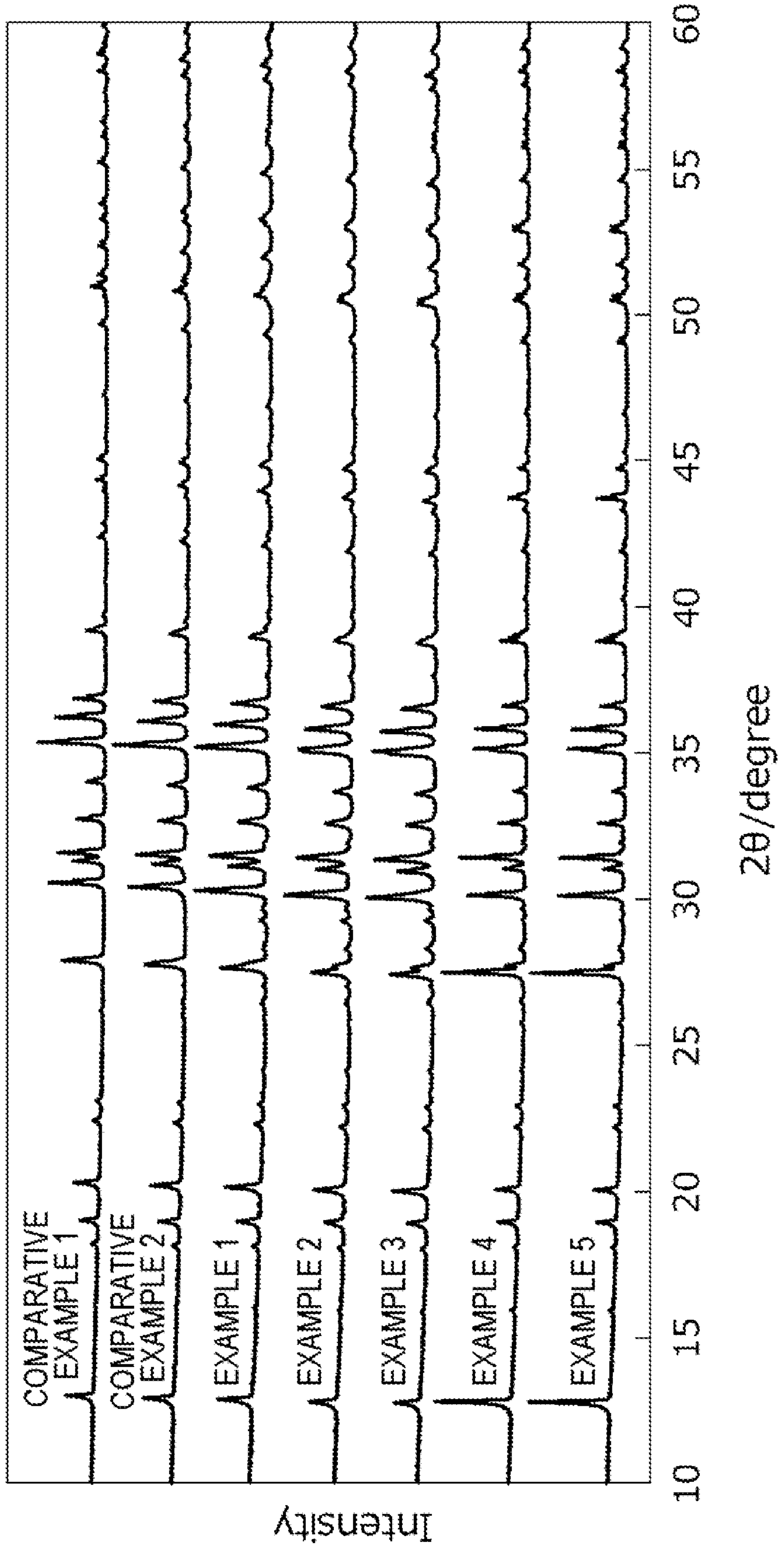
COMPARATIVE EXAMPLE 1
COMPARATIVE EXAMPLE 2
EXAMPLE 1
EXAMPLE 2
EXAMPLE 3
EXAMPLE 4
EXAMPLE 5
Intensity
2θ/degree
10
15
20
25
30
35
40
45
50
55
60

PHOSPHOR POWDER, WAVELENGTH CONVERSION BODY, AND LIGHT EMITTING DEVICE

TECHNICAL FIELD

The present invention relates to a phosphor powder, a wavelength conversion body, and a light emitting device. More specifically, the present invention relates to a phosphor powder capable of emitting infrared light, a wavelength conversion body containing the phosphor powder, and a light emitting device including the wavelength conversion body.

BACKGROUND ART

Thus far, as phosphors that are used in light emitting devices, various phosphors capable of converting blue light into "visible light" having longer wavelengths than blue light, such as red light, like phosphors that are used in white LEDs have been developed. On the other hand, in industrial applications, there is also a need for phosphors capable of converting blue light into infrared light having a wavelength of longer than 700 nm (near-infrared light).

A near-infrared phosphor having a composition represented by Formula (I) below is described in Claim 13 of Patent Document 1.

$$Li_aSr_bLa_cSi_dN_eEu_f \quad (I)$$

(a to f are numbers satisfying a+b+c+d+e+f=100, $0 \leq a \leq 8.22$, $0.22 \leq b \leq 17.33$, $1.12 \leq c \leq 11.36$, $22.41 \leq d \leq 38.09$, $49.47 \leq e \leq 56.09$ and $0.88 \leq f \leq 1.01$.)

Patent Document 2 describes a phosphor containing at least an Eu element, at least one element selected from the group consisting of Al, Y, La, and Gd, a Si element, and a N element and emitting light having wavelengths of equal to or longer than 760 nm when irradiated with ultraviolet light or visible light. Specifically, a phosphor containing Eu, Ba, La, Si, and N as constituent elements is described in Example 35 of this document.

In Non-Patent Document 1, a cause of thermal degradation of a phosphor having a composition represented by $Sr_{2-x}Si_5N_8:Eu_x$ has been considered.

RELATED DOCUMENT

Patent Document

Patent Document 1 International Publication No. WO2019/240150

Patent Document 2 International Publication No. WO2020/203234

Non-Patent Document

Non-Patent Document 1: J. Am. Chem. Soc. 2012, 134, 14108-14117

SUMMARY OF THE INVENTION

Technical Problem

From the viewpoint of lifetime extension and reliability improvement of light emitting devices, phosphors not being easily degraded by heat is important.

This time, the present inventors performed various studies in order to obtain a phosphor powder not being easily degraded by heat, specifically, a phosphor powder not being easily degraded by heat and capable of converting blue light into infrared light (near-infrared light).

Solution to Problem

The present inventors completed inventions to be provided below through studies.

According to the present invention, the following phosphor powders are provided.

A phosphor powder containing a phosphor represented by General Formula (I) below.

$$(Eu_{(1-x)(1-z)}M1_xM2_{(1-x)z})_2(Si_{1-y}Al_y)_5N_8 \quad (I)$$

In General Formula (I),

M1 includes at least La and optionally further includes one or more elements selected from the group consisting of lanthanoid elements other than Y and La, M2 includes at least Ba and optionally further includes one or more elements selected from the group consisting of Mg, Ca, and Sr, x is equal to or more than 0.005 and equal to or less than 0.2, y is equal to or more than 0 and equal to or less than 0.1, and z is more than 0.44 and equal to or less than 0.99.

In addition, according to the present invention, a wavelength conversion body containing the phosphor powder is provided.

In addition, according to the present invention, a light emitting device including the wavelength conversion body is provided.

Advantageous Effects of Invention

According to the present invention, a phosphor powder not being easily degraded by heat is provided. Specifically, according to the present invention, a phosphor powder not being easily degraded by heat and capable of converting blue light into infrared light (near-infrared light) is provided.

BRIEF DESCRIPTION OF THE DRAWINGS

FIG. 1 is X-ray diffraction patterns of phosphor powders obtained in examples.

DESCRIPTION OF EMBODIMENTS

Hereinafter, an embodiment of the present invention will be described in detail while referring to a drawing.

The drawing is simply for description. The present invention should not be interpreted to be limited by the drawing.

<Phosphor Powder>

A phosphor powder of the present embodiment contains a phosphor represented by General Formula (I) below.

$$(Eu_{(1-x)(1-z)}M1_xM2_{(1-x)z})_2(Si_{1-y}Al_y)_5N_8 \quad (I)$$

In General Formula (I),

M1 includes at least La and may further include one or more elements selected from the group consisting of lanthanoid elements other than Y and La, M2 includes at least Ba and may further include one or more elements selected from the group consisting of Mg, Ca, and Sr, x is equal to or more than 0.005 and equal to or less than 0.2, y is equal to or more than 0 and equal to or less than 0.1, and z is more than 0.44 and equal to or less than 0.99.

The phosphor powder of the present embodiment is not easily degraded by heat (the light emitting properties do not easily deteriorate even after the phosphor powder receives heat). The reason therefor is not clear, but is presumed that, in an environment where Ba and Eu coexist, Ba is preferentially oxidized and Eu, which is the light emission center, is relatively less likely to be oxidized. The amount of Ba is appropriately large (z is larger than 0.44), whereby thermal degradation can be sufficiently suppressed. In addition, the amount of Ba is not too large (z is 0.99 or less), whereby there is a tendency that favorable light emitting properties are easy to obtain while thermal degradation is suppressed.

In addition, although the reason is not exactly clear, probably, in association with the fact that thermal degradation is suppressed, in the phosphor powder of the present embodiment, there is a tendency that a decrease in emission intensity in high-temperature environments is relatively small (thermal quenching is suppressed) This fact indicates that the phosphor powder of the present embodiment can be preferably applied to applications where temperature changes are severe, such as in-vehicle applications.

The phosphor represented by General Formula (I) usually has a composition in which part of Eu in a phosphor represented by General Formula $Eu_2Si_5N_8$ has been substituted with M1 (including at least La) and M2 (including at least Ba).

In addition, the phosphor represented by General Formula (I) preferably has a composition in which a part of Si in the phosphor represented by General Formula $Eu_2Si_5N_8$ has been substituted with Al. That is, the phosphor represented by General Formula (I) is preferably the phosphor represented by $Eu_2Si_5N_8$, in which part of Eu has been substituted with M1 and M2 and part of Si has been substituted with at least Al.

x in General Formula (I) represents the degree of Eu being substituted with M1 in the phosphor represented by General Formula $Eu_2Si_5N_8$.

y in General Formula (I) represents the degree of Si being substituted with Al.

z in General Formula (I) represents the degree of Eu being substituted with M2.

When x, y, and z are appropriately adjusted, there is a tendency that resistance to thermal degradation is further increased while favorable fluorescence properties are obtained.

M1 needs to include at least La; however, from the viewpoint of additional improvement in light emitting properties, equal to or more than 50% by atom of all elements corresponding to M1 is preferably La, equal to or more than 70% by atom is more preferably La, equal to or more than 90% by atom is still more preferably La, and substantially all of M1 is particularly preferably La.

M2 needs to include at least Ba; however, from the viewpoint of additional improvement in light emitting properties, equal to or more than 50% by atom of all elements corresponding to M2 is preferably Ba, equal to or more than 70% by atom is more preferably Ba, equal to or more than 90% by atom is still more preferably Ba, and substantially all of M2 is particularly preferably Ba.

x needs to be equal to or more than 0.005 and equal to or less than 0.2 and is preferably equal to or more than 0.01 and equal to or less than 0.2, more preferably equal to or more than 0.01 and equal to or less than 0.1 and still more preferably equal to or more than 0.02 and equal to or less than 0.07.

y needs to be equal to or more than 0 and equal to or less than 0.1 and is preferably more than 0 and equal to or less than 0.1, more preferably equal to or more than 0.01 and equal to or less than 0.06 and still more preferably more than 0.01 and equal to or less than 0.04.

z needs to be more than 0.44 and equal to or less than 0.99 and is preferably more than 0.44 and equal to or less than 0.9, more preferably equal to or more than 0.45 and equal to or less than 0.8 and still more preferably equal to or more than 0.5 and equal to or less than 0.8.

The composition (values of x, y, and z) of the phosphor can be learned through ICP emission spectroscopy.

Appropriate adjustment of the values of x, y, and/or z makes it possible to optimize various performances. As one viewpoint, when the value of z is equal to or less than 0.8, there is a tendency that thermal degradation is less likely to occur and a relatively high emission intensity can be obtained. As another viewpoint, when the value of z is equal to or more than 0.5, there is a tendency that thermal degradation is further suppressed and thermal quenching is further suppressed.

Incidentally, one reason for the phosphor represented by General Formula (I) to preferably have a composition in which a part of Si in the phosphor represented by General Formula $Eu_2Si_5N_8$ has been substituted with Al (y is more than 0) is that the charge neutrality rule is satisfied. From the viewpoint of satisfying the charge neutrality rule, it is also conceivable to satisfy, for example, the following (i) to (iii). However, from the viewpoint of the fluorescence properties or the like of a phosphor powder to be obtained, the phosphor represented by General Formula (I) preferably has a composition in which part of Si in the phosphor represented by General Formula $Eu_2Si_5N_8$ has been substituted with Al.

(i) The same molar amount of Al as La is caused to form solid solutions in Si sites (described above). Incidentally, the reason for Al to be selected is that, among trivalent cations, the effective ionic radius of Al is close to that of Si. It is considered that the use of Ga instead of Al is also possible.

(ii) The same molar amount of Li as La is caused to form solid solutions in Eu sites. It is considered that Na, K, or Rb may also be present instead of Li.

(iii) It is considered that N as much as ⅓ of the molar amount of La may be added (N becomes excessive) or O as much as ½ of the molar amount of La may be added.

For reference, "phosphor represented by General Formula $Eu_2Si_5N_8$" is known as "258 phosphor" based on the number representing the compositional ratio of each element (refer to Japanese Unexamined Patent Publication No. 2010-270196 or the like). As described above, the phosphor represented by General Formula (I) usually contains the phosphor represented by General Formula $Eu_2Si_5N_8$ as the mother nucleus structure.

The crystal system of the phosphor represented by General Formula $Eu_2Si_5N_8$ is the orthorhombic crystal system. According to documents, the lattice constants of the phosphor represented by General Formula $Eu_2Si_5N_8$ are a=0.57094 (4) nm, b=0.68207 (4) nm, c=0.93291 (6) nm, and $\alpha=\gamma=\beta=90.00°$. In addition, the lattice volume (a*b*c) is approximately 0.363 $nm^3$.

The lattice constant or lattice volume that is obtained through an X-ray diffraction method becomes a favorable index of the degree of substitution with Ba or the like (reference: Vegard's law).

Specifically, in the crystal structure of the phosphor represented by General Formula (I), the unit lattice volume (lattice volume) is preferably equal to or more than 0.368

$nm^3$ and less than 0.378 $nm^3$ and more preferably equal to or more than 0.368 $nm^3$ and equal to or less than 0.377 $nm^3$. In the phosphor having a lattice volume within the above-described range, the degree of substitution with Ba or the like is appropriate, and there is a tendency that resistance to thermal degradation is further increased while favorable fluorescence properties are obtained.

Incidentally, the a-axis length of the crystal lattice is preferably equal to or more than 0.574 nm and equal to or less than 0.579 nm and more preferably equal to or more than 0.575 nm and equal to or less than 0.578 nm.

In addition, the b-axis length of the crystal lattice is preferably equal to or more than 0.685 nm and equal to or less than 0.695 nm and more preferably equal to or more than 0.686 nm and equal to or less than 0.694 nm.

In addition, the c-axis length of the crystal lattice is preferably equal to or more than 0.935 nm and equal to or less than 0.941 nm and more preferably equal to or more than 0.936 nm and equal to or less than 0.940 nm.

The resistance to thermal degradation of the phosphor powder of the present embodiment can be quantified by, for example, calculating $I_f/I_i$ from the values of $I_f$ and $I_i$ that are measured as described below. The value of $I_f/I_i$ is preferably equal to or more than 0.4, more preferably equal to or more than 0.6, and still more preferably equal to or more than 0.8. The upper limit of the value of $I_f/I_i$ is usually one.

The peak intensity of an emission spectrum when the phosphor powder is irradiated with laser light having a wavelength of 452 nm at room temperature (typically 23° C.) is represented by $I_i$.

The peak intensity of an emission spectrum when the phosphor powder that has been heated at 200° C. for 1 hour and then cooled to room temperature is irradiated with laser light having a wavelength of 452 nm at room temperature is represented by $I_f$.

The phosphor powder of the present embodiment irradiated with blue light typically emits infrared light (near-infrared light). In other words, the phosphor powder of the present embodiment is usually a (near-)infrared phosphor.

Quantitatively, the peak wavelength of an emission spectrum when the phosphor powder of the present embodiment is irradiated with laser light having a wavelength of 450 nm is typically equal to or more than 800 nm, specifically equal to or more than 800 nm and equal to or less than 940 nm and more specifically equal to or more than 800 nm and equal to or less than 900 nm.

The particle size distribution of the phosphor powder of the present embodiment needs to be adjusted as appropriate depending on the application of the phosphor powder, desired fluorescence properties, and the like.

The volume-based cumulative 50% diameter (median diameter) $D_{50}$ of the phosphor powder of the present embodiment measured by a laser diffraction scattering method is, for example, 0.1 to 50 μm, specifically 0.1 to 10 μm and more specifically 0.5 to 5 μm.

The volume-based cumulative 90% diameter $D_{90}$ of the phosphor powder of the present embodiment measured by a laser diffraction scattering method is, for example, 1 to 150 μm, specifically 1 to 20 μm and more specifically 2 to 10 μm.

The volume-based cumulative 10% diameter $D_{10}$ of the phosphor powder of the present embodiment measured by a laser diffraction scattering method is, for example, 0.05 to 10 μm, specifically 0.05 to 5 μm and more specifically 0.05 to 2 μm.

<Method for Producing Phosphor Powder>

The phosphor powder of the present embodiment can be produced by, for example, a series of steps including the following (1) to (3).

(1) Preparation step of raw material mixed powder (2) Firing step (3) Pulverization step of sintered compact (1) to (3) will be specifically described below.

(1) Preparation Step of Raw Material Mixed Powder

In the preparation step of a raw material mixed powder, a raw material mixed powder is normally obtained by sufficiently mixing suitable raw material powders using a mortar or the like. From the viewpoint of avoiding reactions with oxygen or moisture, the raw material powders are preferably handled and mixed in an inert gas atmosphere of nitrogen gas, rare gas, or the like.

Preferable examples of the raw material powders include nitrides. Specific examples thereof include the powders of LaN, EuN, $Ba_3N_2$, $Si_3N_4$, and the like. In a case where an attempt is made to obtain a phosphor having y of more than 0 in General Formula (I) (that is, containing Al), it is preferable to further use an AlN powder. In addition, the kinds and amounts of the raw material powders may be adjusted in consideration of the elemental composition of the target phosphor.

The mixing proportion of each raw material powder may be adjusted as appropriate depending on the target composition.

(2) Firing Step

In the firing step, the raw material mixed powder prepared in the preparation step of a raw material mixed powder (1) is loaded into a suitable container and heated using a firing furnace or the like.

A firing temperature is preferably equal to or higher than 1400° C. and equal to or lower than 2000° C. and more preferably equal to or higher than 1500° C. and equal to or lower than 1800° C. from the viewpoint of causing reactions to sufficiently proceed and the viewpoint of suppressing the volatilization of the components.

A firing time is preferably equal to or longer than 2 hours and equal to or shorter than 24 hours and more preferably equal to or longer than 2 hours and equal to or shorter than 16 hours from the viewpoint of causing reactions to sufficiently proceed and the viewpoint of suppressing the volatilization of the components.

A firing step is preferably performed in an inert gas atmosphere of nitrogen gas or the like. In addition, it is preferable to appropriately adjust the pressure of the firing atmosphere. Specifically, the pressure of the firing atmosphere is preferably equal to or more than 0.5 MPa·G. In a case where the firing temperature is a high temperature, the phosphor tends to be easily decomposed, but the high pressure of the firing atmosphere can suppress the decomposition of the phosphor.

Incidentally, when industrial productivity is taken into account, the pressure of the firing atmosphere is preferably equal to or less than 1 MPa-G.

It is preferable that the container into which the raw material mixed powder is loaded is composed of a material that is stable in high-temperature inert gas atmosphere and does not react with the raw material mixed powder or a reaction product thereof. A material of the container is preferably boron nitride.

(3) Pulverization Step of Sintered Compact

The sintered compact obtained in (2) is usually in a massive form. Therefore, it is preferable to pulverize the massive sintered compact into a powder form by mechanically applying a force thereto.

In the pulverization, various devices such as a crusher, a mortar, a ball mill, a vibration mill, a jet mill, and a stamp mill can be used. Two or more of these devices may be combined for the pulverization.

The particle sizes of the phosphor powder can be adjusted by changing the pulverization conditions.

The production steps of the phosphor powder of the present embodiment may include an optional step other than (1) to (3) described above.

Examples of the optional step include, for example, an acid treatment step, a classification step, and the like. There are cases where, for example, impurities, heterogeneous phases (phases that do not contribute to desired light emission) on the particle surfaces of the phosphor, or the like can be removed or reduced by bringing the phosphor powder into contact with an acid. In addition, there are cases where the light emitting properties are improved by removing phosphor particles that are too fine in the phosphor powder by the classification step. Furthermore, there are cases where a wavelength conversion body having a higher quality can be produced by removing coarse phosphor particles in the phosphor powder by the classification step.

<Wavelength Conversion Body and Light Emitting Device>

A wavelength conversion body of the present embodiment contains the above-described phosphor powder.

The wavelength conversion body converts applied light (excitation light) to emit light having a light emission peak in a wavelength range different from that of the excitation light.

The wavelength conversion body is capable of configuring at least part of a light emitting device to be described below.

The wavelength conversion body is capable of emitting, for example, light having a light emission peak in a wavelength range of equal to or more than 600 nm and equal to or less than 900 nm.

The wavelength conversion body may or may not contain phosphors other than the above-described phosphor powder.

The wavelength conversion body may be composed only of the above-described phosphor powder or may be composed of a base material in which the above-described phosphor powder has been dispersed. The base material is not particularly limited, and examples thereof include glass, resins, inorganic materials, and the like.

A light emitting device of the present embodiment includes the above-described wavelength conversion body. The light emitting device can be used in various applications such as sensing, inspection, analysis, security, optical communication, and medical application. Examples of the light emitting device include LED packages, light sources, spectrophotometers, food analyzers, wearable devices, infrared cameras, moisture measuring devices, gas detectors, and the like.

For example, the light emitting device includes a light emitting element and a wavelength conversion body that converts the wavelength of light applied from the light emitting element. The shape of the wavelength conversion body is not particularly limited. As an example, the wavelength conversion body is configured in a plate shape. As another example, the wavelength conversion body is configured to encapsulate a part of the light emitting element or the entire light emitting surface.

As the light emitting element, a blue light emitting diode is usually selected.

Hitherto, the embodiment of the present invention has been described, but the embodiment is an example of the present invention, and it is possible to adopt various configurations other than the above-described configuration. In addition, the present invention is not limited to the above-described embodiment, and modifications, improvements, and the like are included in the present invention as long as the object of the present invention can be achieved.

Examples

The embodiment of the present invention will be described in detail based on examples and comparative examples. It is mentioned for confirmation that the present invention is not limited only to the examples.

<Raw Materials>

The following raw materials were prepared.

LaN: manufactured by Kojundo Chemical Laboratory. Co., Ltd.

EuN: manufactured by Taiheiyo Cement Corporation $Ba_3N_2$: manufactured by Materion Corporation, #325 mesh $Si_3N_4$: manufactured by Ube Industries, E10 grade AlN: manufactured by Tokuyama Corporation, E grade <Producing Phosphor Powder>

The procedure was as follows.

(1) Mixing of Raw Materials

Individual raw materials were weighed to masses shown as "Weighed values" in Table 1 and sufficiently mixed together using a mortar to obtain a mixture. These weighing and mixing were performed in a nitrogen gas atmosphere.

For reference, in Table 1, the designed composition of individual elements and the values of x, y, and z in General Formula (I) (with an assumption of a case where all of the raw materials have reacted appropriately) were also shown.

TABLE 1

| | | | | Designed composition/mol | | | | | Weighed value/g | | | | |
|---|---|---|---|---|---|---|---|---|---|---|---|---|---|
| Sample name | x | y | z | Eu | Ba | La | Si | Al | EuN | $Ba_3N_2$ | LaN | $Si_3N_4$ | AlN |
| Example 1 | 0.05 | 0.02 | 0.50 | 0.95 | 0.95 | 0.10 | 4.90 | 0.10 | 0.578 | 0.511 | 0.056 | 0.840 | 0.015 |
| Example 2 | 0.05 | 0.02 | 0.75 | 0.48 | 1.43 | 0.10 | 4.90 | 0.10 | 0.294 | 0.779 | 0.057 | 0.854 | 0.015 |
| Example 3 | 0.05 | 0.02 | 0.90 | 0.19 | 1.71 | 0.10 | 4.90 | 0.10 | 0.119 | 0.945 | 0.058 | 0.863 | 0.015 |
| Example 4 | 0.01 | 0.004 | 0.75 | 0.50 | 1.49 | 0.02 | 4.98 | 0.02 | 6.149 | 16.303 | 0.229 | 17.431 | 0.061 |
| Example 5 | 0.005 | 0.002 | 0.75 | 0.50 | 1.49 | 0.01 | 4.99 | 0.01 | 6.180 | 16.384 | 0.114 | 17.465 | 0.031 |
| Comparative Example 1 | 0.05 | 0.02 | 0.00 | 1.90 | 0.00 | 0.10 | 4.90 | 0.10 | 1.119 | 0.000 | 0.054 | 0.813 | 0.015 |
| Comparative Example 2 | 0.05 | 0.02 | 0.25 | 1.43 | 0.48 | 0.10 | 4.90 | 0.10 | 0.853 | 0.251 | 0.055 | 0.826 | 0.015 |

(2) Firing

The mixture obtained in (1) was put into a boron nitride container (container size: 6 mL) and heated up to 1600° C. at a heating rate of 20° C./min. In addition, the mixture was held at 1600° C. for 4 hours. A massive sintered compact was thus obtained.

The firing atmosphere was set as described below.

Atmospheric gas: $N_2$, atmospheric pressure: 0.80 MPa-G, gas introduction temperature: 400° C.

(3) Pulverization

The massive sintered compact obtained in (2) was pulverized using an alumina mortar. A phosphor powder was thus obtained. Incidentally, the degree of pulverization was adjusted as appropriate so that the $D_{10}$, $D_{50}$, and $D_{90}$ of the phosphor powder of each of the examples and the comparative examples became numerical values shown in Table 2 below. Particularly, in Examples 4 and 5, the pulverization force was set to be weaker or the pulverization time was set to be shorter than those in other examples and comparative examples.

<Analysis of Composition by ICP Emission Spectroscopy>

The composition was analyzed using a device manufactured by Agilent Technologies International Japan, Ltd. (model number: 5110VDV). Specifically, the composition was analyzed by the following procedure.

First, 10 mg of the phosphor powder was put into a platinum crucible, 2 g of an alkaline flux was added thereto, and then the phosphor powder was melted in an electric furnace. After the phosphor powder was cooled in the air, 20 mL of HCl was added to the platinum crucible, and the phosphor powder was heated and dissolved in a warm bath to obtain a solution. After that, the volume of the obtained solution was adjusted to 100 mL. This 100 mL solution was diluted 10 times with pure water to prepare a test liquid. This test liquid was set in the above-described device, and the composition was analyzed. In addition, x, y, and z in General Formula (I) were obtained based on the analysis results.

The analysis results of the composition are shown in Table 3. In Table 3, the values shown as "Results of compositional analysis/mol" are relative molar amounts.

TABLE 3

| | | | | Results of compositional analysis/mol | | | | |
|---|---|---|---|---|---|---|---|---|
| Sample name | x | y | z | Eu | Ba | La | Si | Al |
| Example 1 | 0.052 | 0.02 | 0.48 | 0.91 | 0.85 | 0.09 | 4.90 | 0.11 |
| Example 2 | 0.056 | 0.02 | 0.74 | 0.44 | 1.26 | 0.10 | 4.90 | 0.10 |
| Example 3 | 0.053 | 0.02 | 0.89 | 0.18 | 1.54 | 0.09 | 4.90 | 0.10 |
| Example 4 | 0.011 | 0.006 | 0.76 | 0.44 | 1.38 | 0.02 | 4.90 | 0.03 |
| Example 5 | 0.006 | 0.004 | 0.76 | 0.45 | 1.40 | 0.01 | 4.90 | 0.02 |
| Comparative Example 1 | 0.059 | 0.02 | 0.00 | 1.89 | 0.00 | 0.11 | 4.90 | 0.10 |
| Comparative Example 2 | 0.053 | 0.02 | 0.25 | 1.34 | 0.44 | 0.10 | 4 90 | 0.12 |

<Measurement of Particle Size Distribution>

The particle size distribution was measured by a laser diffraction scattering method based on JIS Z 8825:2013 using LC13 320 (manufactured by Beckman Coulter, Inc.). The specific procedure was as described below.

A small amount of the phosphor powder was injected to an aqueous solution to which 0.05% by weight of sodium hexametaphosphate had been added as a dispersant, and a dispersing treatment was performed with a horn-type ultrasound homogenizer (output 300 W, horn diameter 26 mm) to measure the particle size distribution. The $D_{10}$, $D_{50}$, and $D_{90}$ were obtained from the obtained volume frequency particle size distribution curve.

The results are shown in Table 2.

TABLE 2

| Sample name | $D_{10}$ (μm) | $D_{50}$ (μm) | $D_{90}$ (μm) |
|---|---|---|---|
| Example 1 | 0.10 | 0.80 | 4.07 |
| Example 2 | 0.12 | 1.03 | 3.96 |
| Example 3 | 0.14 | 1.12 | 4.07 |
| Example 4 | 6.44 | 36.95 | 109.32 |
| Example 5 | 4.31 | 20.72 | 74.28 |
| Comparative Example 1 | 2.66 | 13.02 | 78.01 |
| Comparative Example 2 | 0.15 | 1.98 | 6.91 |

<X-Ray Powder Diffraction Measurement>

XRD patterns of the phosphor powders were obtained using a device Ultima IV from Rigaku Corporation. The obtained XRD patterns are shown in FIG. 1.

It was confirmed by analyzing the obtained spectrum using software that the phosphor powders of Examples 1 to 5 included a phosphor containing an orthorhombic phosphor represented by General Formula $Eu_2Si_5N_8$ as the mother nucleus structure.

In addition, the lattice constants a, b, and c and the lattice volume V were obtained from the analyses of the obtained XRD patterns. These values are shown in Table 4.

TABLE 4

| | Lattice constant (nm) | | | Lattice volume ($nm^3$) |
|---|---|---|---|---|
| Sample name | a | b | C | V |
| Example 1 | 0.575 | 0.688 | 0.936 | 0.370 |
| Example 2 | 0.577 | 0.691 | 0.937 | 0.374 |
| Example 3 | 0.578 | 0.693 | 0.939 | 0.376 |
| Example 4 | 0.576 | 0.692 | 0.937 | 0.374 |
| Example 5 | 0.576 | 0.692 | 0.937 | 0.374 |
| Comparative Example 1 | 0.571 | 0.681 | 0.934 | 0.363 |
| Comparative Example 2 | 0.573 | 0.684 | 0.935 | 0.366 |

<Emission Spectrum Measurement>

Emission spectra when the phosphor powders were irradiated with excitation light having a wavelength of 450 nm (light obtained by monochromatizing continuous wavelength light that was emitted from a xenon lamp with a diffraction grating) were obtained using Fluorolog-3-iHR-NIR manufactured by Horiba, Ltd. In addition, the peak wavelengths of the obtained spectra and the integral intensities in a wavelength range of 500 to 1400 nm were read.

The peak wavelength and intensity ratio when the integral intensity in Comparative Example 1 was set to 1.00 of each phosphor powder are shown in Table 5.

TABLE 5

| Sample name | Peak position of emission spectrum (nm) | Integral intensity |
|---|---|---|
| Example 1 | 838 | 1.02 |
| Example 2 | 825 | 0.99 |
| Example 3 | 818 | 0.77 |
| Example 4 | 821 | 1.23 |
| Example 5 | 663 | 1.28 |
| Comparative Example 1 | 852 | 1.00 |
| Comparative Example 2 | 834 | 0.97 |

As shown in Table 5, the phosphor powders of Examples 1 to 5 emitted near-infrared light when irradiated with blue light.

In addition, the intensities of fluorescence emitted from the phosphor powders of Examples 1 to 5 were approximately the same as those in Comparative Examples 1 and 2. Particularly, the intensities of fluorescence emitted from the phosphor powders of Examples 1 and 2 were as high as those in Comparative Examples 1 and 2.

<Evaluation of Thermal Degradation>

An upright microscope manufactured by Olympus Corporation, a multichannel spectrometer MCPD-9800 3095 (peak wavelength: 452 nm) manufactured by Otsuka Electronics Co., Ltd., a blue laser light source manufactured by Craft Center SAWAKI Inc., and a temperature property evaluation stage HFS600 (including a heater for heating and a water-cooling mechanism for cooling) manufactured by Linkam Scientific Instruments were combined together to assemble a device capable of evaluating the light emission of a single phosphor particle.

The degree of thermal degradation was evaluated using this device by the procedure of (1) to (5) below.

(1) A quartz petri dish containing 0.1 g of the phosphor powder was placed on the evaluation stage.

(2) The phosphor powder was irradiated with blue laser light at room temperature (23° C.), and an emission spectrum was measured.

In addition, the peak intensity (maximum value of the spectrum) of the obtained emission spectrum was represented by $I_i$.

(3) The phosphor powder was heated from room temperature using the heater for heating at a rate of 100° C./min., and held at 200° C. for 1 hour.

(4) The heater for heating was turned off, and the phosphor powder was cooled with the water-cooling mechanism for cooling. After approximately 1 hour had elapsed, the phosphor powder cooled to room temperature was irradiated with blue laser light, and an emission spectrum was measured. In addition, the peak intensity (maximum value of the spectrum) of the obtained emission spectrum was represented by $I_f$.

(5) A value of $I_f/I_i$ was calculated and regarded as an index of thermal degradation.

The results are shown in Table 6.

TABLE 6

| Sample name | $I_f/I_i$ |
|---|---|
| Example 1 | 0.89 |
| Example 2 | 0.96 |
| Example 3 | 0.96 |
| Example 4 | 0.97 |
| Example 5 | 0.98 |
| Comparative Example 1 | 0.35 |
| Comparative Example 2 | 0.77 |

As shown in Table 6, in the phosphor powders of Examples 1 to 5 (containing the phosphors having z of more than 0.44 and equal to or less than 0.99 in General Formula (I)), thermal degradation was suppressed compared with the phosphor powders of Comparative Examples 1 and 2 (z was equal to or less than 0.44 in General Formula (I)). In particular, thermal degradation was suppressed in the phosphor powders of Examples 2 and 3 containing the phosphors having a relatively large z (the Ba substitution rate was high).

<Evaluation of Thermal Quenching>

In (3) for <Evaluation of thermal degradation>, after 10 minutes from when the temperatures of the phosphor powders reached 200° C., the phosphor powders were irradiated with blue laser light, and emission spectra were measured. In addition, the peak intensity (maximum value of the spectrum) of the obtained emission spectrum was represented by I'. In addition, the value of $I'/I_i$ was regarded as an index of thermal quenching.

The results are shown in Table 7.

TABLE 7

| Sample name | $I'/I_i$ |
|---|---|
| Example 1 | 0.22 |
| Example 2 | 0.41 |
| Example 3 | 0.45 |
| Example 4 | 0.41 |
| Example 5 | 0.38 |
| Comparative Example 1 | 0.09 |
| Comparative Example 2 | 0.17 |

As shown in Table 7, in the phosphor powders of Examples 1 to 5 (containing the phosphors having z of more than 0.44 and equal to or less than 0.99 in General Formula (I)), thermal quenching was difficult to perform compared with the phosphor powders of Comparative Examples 1 and 2 (z was equal to or less than 0.44 in General Formula (I)). In particular, thermal quenching was difficult to perform in the phosphor powders of Examples 2 and 3 containing the phosphors having a relatively large z (the Ba substitution rate was high).

This application claims priority on the basis of Japanese Patent Application No. 2021-032318 filed on Mar. 2, 2021, the entire disclosure of which is incorporated herein by reference.

The invention claimed is:

1. A phosphor powder comprising:

a phosphor represented by General Formula (I) below, $$(Eu_{(1-x)(1-z)}M1_xM2_{(1-x)z})_2(Si_{1-y}Al_y)_5N_8 \quad (I)$$

in General Formula (I),

M1 includes at least La and optionally further includes one or more elements selected from the group consisting of lanthanoid elements other than Y and La, M2 includes at least Ba and optionally further includes one or more elements selected from the group consisting of Mg, Ca, and Sr, x is equal to or more than 0.005 and equal to or less than 0.2, y is equal to or more than 0 and equal to or less than 0.1, and z is more than 0.44 and equal to or less than 0.99, wherein, in a crystal structure of the phosphor, a unit lattice volume is equal to or more than 0.368 $nm^3$ and less than 0.378 $nm^3$.

2. The phosphor powder according to claim 1, wherein, in General Formula (I), y is more than 0 and equal to or less than 0.1.

3. The phosphor powder according to claim 1, wherein, when a peak intensity of an emission spectrum when the phosphor powder is irradiated with laser light having a wavelength of 452 nm at room temperature is represented by $I_i$, and a peak intensity of an emission spectrum when the phosphor powder that has been heated at 200° C. for 1 hour and then cooled to room temperature is irradiated with laser light having a wavelength of 452 nm is represented by $I_f$, a value of $I_f/I_i$ is equal to or more than 0.4.

4. A wavelength conversion body comprising:

the phosphor powder according to claim 1.

5. A light emitting device comprising:

the wavelength conversion body according to claim 4.

6. A phosphor powder comprising:

a phosphor represented by General Formula (I) below, $$(Eu_{(1-x)(1-z)}M1_xM2_{(1-x)z})_2(Si_{1-y}Al_y)_5N_8 \quad (I)$$

in General Formula (I),

M1 includes at least La and optionally further includes one or more elements selected from the group consisting of lanthanoid elements other than Y and La, M2 includes at least Ba and optionally further includes one or more elements selected from the group consisting of Mg, Ca, and Sr, x is equal to or more than 0.005 and equal to or less than 0.2, y is equal to or more than 0 and equal to or less than 0.1, and z is more than 0.44 and equal to or less than 0.99, wherein a peak wavelength of an emission spectrum when the phosphor powder is irradiated with light having a wavelength of 450 nm is equal to or more than 800 nm.

* * * * *